US012627271B2

(12) United States Patent
Huang

(10) Patent No.: US 12,627,271 B2
(45) Date of Patent: May 12, 2026

(54) AMPLIFIER CIRCUIT HAVING RESET MECHANISM

(71) Applicant: REALTEK SEMICONDUCTOR CORPORATION, Hsinchu (TW)

(72) Inventor: Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 461 days.

(21) Appl. No.: 18/237,921

(22) Filed: Aug. 25, 2023

(65) Prior Publication Data

US 2024/0072743 A1    Feb. 29, 2024

(30) Foreign Application Priority Data

Aug. 30, 2022    (TW) .................................. 111132784

(51) Int. Cl.
　　*H03F 3/45*　　　(2006.01)
　　*H03F 1/02*　　　(2006.01)
　　*H03K 5/24*　　　(2006.01)

(52) U.S. Cl.
　　CPC ....... *H03F 3/45183* (2013.01); *H03K 5/2481* (2013.01); *H03F 2203/45652* (2013.01)

(58) Field of Classification Search
　　CPC ....... H03F 3/45183; H03F 2203/45652; H03F 3/45237; H03F 3/72; H03K 5/2481
　　USPC .................................................. 330/252–261
　　See application file for complete search history.

(56) References Cited

U.S. PATENT DOCUMENTS

| | | | | |
|---|---|---|---|---|
| 7,135,921 B2 * | 11/2006 | Tsuchi | ................ | H03F 3/45183 |
| | | | | 330/285 |
| 7,999,612 B2 | 8/2011 | Hsieh | | |
| 8,120,424 B2 | 2/2012 | Luff | | |
| 8,198,937 B1 | 6/2012 | Vilas Boas et al. | | |
| 8,536,947 B2 | 9/2013 | Wang et al. | | |

(Continued)

FOREIGN PATENT DOCUMENTS

| | | |
|---|---|---|
| TW | 201101677 A | 1/2011 |
| TW | 201206054 A | 2/2012 |
| TW | I384751 B | 2/2013 |

OTHER PUBLICATIONS

"Amplifier", U.S. Appl. No. 18/333,234 (111A-071US), Jul. 6, 20202.

(Continued)

*Primary Examiner* — Hieu P Nguyen
(74) *Attorney, Agent, or Firm* — WPAT, PC

(57)　　　ABSTRACT

The present disclosure discloses an amplifier circuit having reset mechanism. A pair of upper-half branches are electrically coupled between a first supply voltage and a pair of differential output terminals, are symmetrical and each includes at least one P-type transistor. A pair of lower-half branches are electrically coupled between the pair of differential output terminals and a second supply voltage, are symmetrical and each includes at least one N-type transistor. The P-type transistors and the N-type transistors are categorized into transistor groups that perform differential signal receiving process in turn in an interlaced manner under an interlaced input mode and perform reset signal receiving process to be turned on and be AC grounded when the differential signal receiving process is not performed such that the differential output terminals generate differential outputs.

11 Claims, 9 Drawing Sheets

100

(56)                References Cited

U.S. PATENT DOCUMENTS 9,853,615 B2 *  12/2017  Akter ................. H03F 3/45179
2017/0207760 A1    7/2017  Werking

OTHER PUBLICATIONS

"Amplification Circuit", U.S. Appl. No. 18/360,467 (111A-072US), Aug. 1, 2022.

* cited by examiner

AMPLIFIER CIRCUIT HAVING RESET MECHANISM

BACKGROUND OF THE INVENTION

1. Field of the Invention

The present disclosure relates to an amplifier circuit having reset mechanism.

2. Description of Related Art

Due to the development of portable electronic products and 5G technology, more and more applications of mobile communication and Internet of Things (IoT) are presented such that low power consumption becomes a major issue in the design of the electronic products. In analog circuits, amplifiers are the main source of power consumption and the rated voltage becomes lower and lower. As a result, the design of the complementary input amplifier becomes popular.

However, when an interlaced input is performed by the complementary input amplifier, the current input signal at the input terminal may be affected by remained electrical charges of the previous input signal presented due to parasitic capacitors at the input terminal. An inter-symbol interference is thus generated.

SUMMARY OF THE INVENTION

In consideration of the problem of the prior art, an object of the present disclosure is to provide an amplifier circuit having reset mechanism.

The present invention discloses an amplifier circuit having reset mechanism that includes a pair of upper-half branches and a pair of lower-half branches. The pair of upper-half branches are electrically coupled between a first supply voltage and a pair of differential output terminals, wherein the pair of upper-half branches are symmetrical and each includes at least one P-type transistor, wherein the pair of upper-half branches are symmetrical and each includes at least one P-type transistor. The pair of lower-half branches are electrically coupled between the pair of differential output terminals and a second supply voltage, wherein the lower-half branches are symmetrical and each includes at least one N-type transistor. The P-type transistors included by the upper-half branches and the N-type transistors included by the lower-half branches are categorized into a plurality of transistor groups such that the transistor groups in turn perform a differential signal receiving process in an interlaced manner under an interlaced input mode, and the transistor groups perform a reset signal receiving process when the differential signal receiving process is not performed to be turned on and be AC grounded such that the differential output terminals generate differential outputs. Each of the transistor groups includes M pairs of transistors each having a symmetrical input/output characteristic relative to the differential output terminals, M being a positive integer larger than or equal to 1.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide an amplifier circuit having reset mechanism to perform alternating current (AC) reset on the transistor group when the transistor group does not perform the differential signal receiving process, to reduce the effect of the remained electrical charges from the parasitic capacitors on the differential output signal generated by the transistor groups operated in an interlaced input mode.

Figure 1:
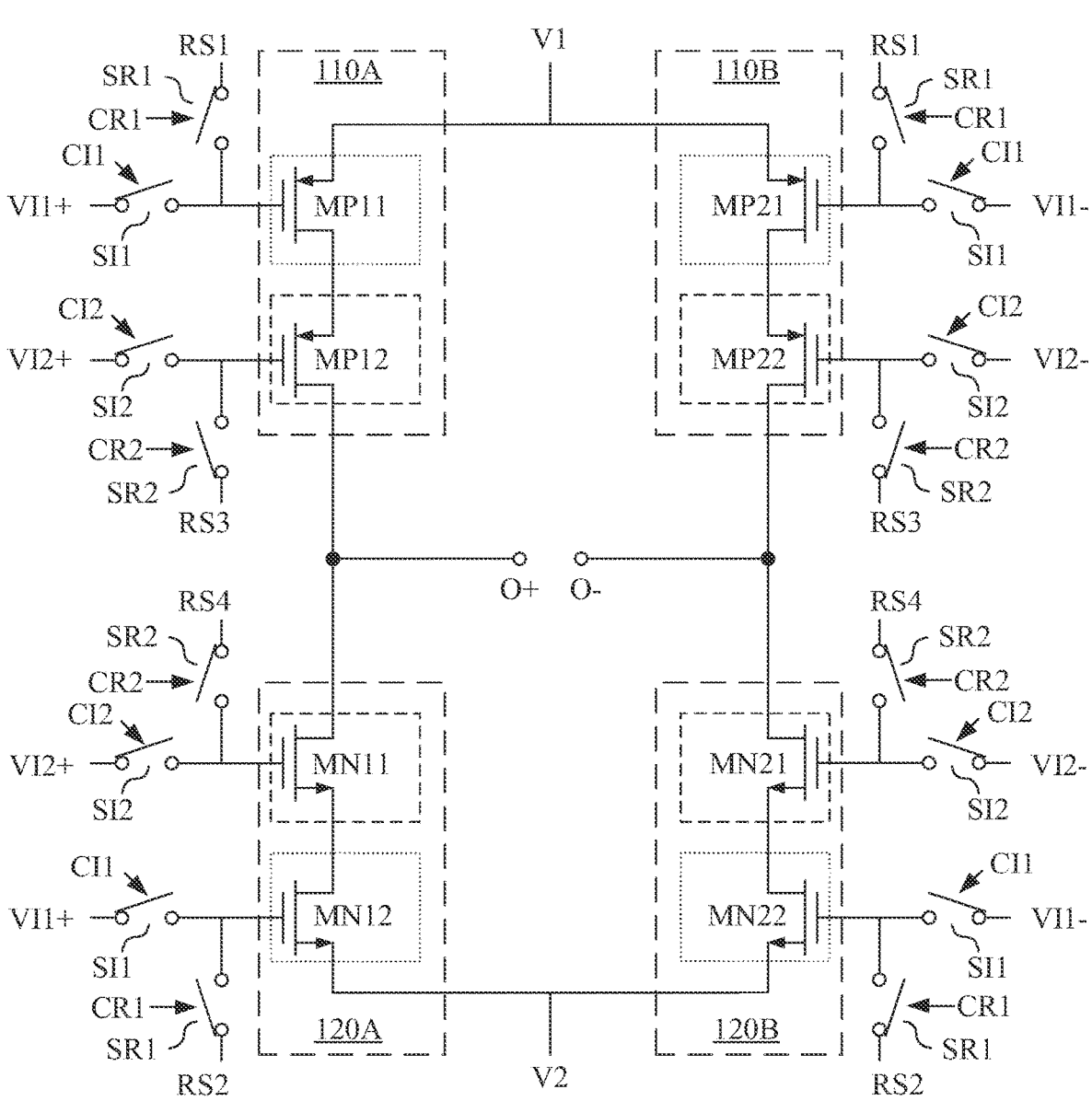
FIG. 1 illustrates a block diagram of an image processing circuit having output timing adjustment mechanism according to an embodiment of the present invention.

Reference is now made to FIG. 1. FIG. 1 illustrates a circuit diagram of an amplifier circuit 100 having reset mechanism according to an embodiment of the present invention. The amplifier circuit 100 includes a pair of upper-half branches 110A and 110B and a pair of lower-half branches 120A and 120B.

The upper-half branches 110A and 110B are electrically coupled between a first supply voltage V1 and a pair of differential output terminals O+ and O−. In an embodiment, the first supply voltage V1 is such as, but not limited to 1 volt.

The upper-half branches 110A and 110B are symmetrical and each includes at least one P-type transistor. In the embodiment in FIG. 1, each of the upper-half branches 110A and 110B includes two P-type transistors. The upper-half branch 110A includes a first P-type transistor MP11 and a second P-type transistor MP12 in turn electrically coupled between the first supply voltage V1 and the differential output terminal O+. The upper-half branch 110B includes a first P-type transistor MP21 and a second P-type transistor MP22 in turn electrically coupled between the first supply voltage V1 and the differential output terminal O−.

The lower-half branches 120A and 120B are electrically coupled between the differential output terminals O+ and O− and a second supply voltage V2. In an embodiment, the second supply voltage V2 is such as, but not limited to 0 volt.

The lower-half branches 120A and 120B are symmetrical and each includes at least one N-type transistor. In the embodiment in FIG. 1, each of the lower-half branches 120A and 120B includes two N-type transistors. The lower-half branch 120A includes a first N-type transistor MN11 and a second N-type transistor MN12 in turn electrically coupled between the differential output terminal O+ and the second supply voltage V2. The lower-half branch 120B includes a first N-type transistor MN21 and a second N-type transistor MN22 in turn electrically coupled between the differential output terminal O− and the second supply voltage V2.

The P-type transistor of each of the upper-half branches 110A and 110B and the N-type transistor of each of the lower-half branches 120A and 120B are categorized into a plurality of transistor groups such that the transistor groups in turn perform a differential signal receiving process in an interlaced manner under an interlaced input mode, and the transistor groups perform a reset signal receiving process when the differential signal receiving process is not performed to be turned on and be AC grounded such that the differential output terminals O+ and O− generate differential outputs.

Each of the transistor groups includes M pairs of transistors each having a symmetrical input/output characteristic relative to the differential output terminals O+ and O−, M being a positive integer larger than or equal to 1. In an embodiment, input/output characteristic includes such as, but not limited to an output impedance, a transconductance, a gain, a power supply rejection ratio (PSRR) or a combination thereof between the differential signal input received by the M pairs of transistors and the different signal output generated at the differential output terminals O+ and O−.

Take the embodiment in FIG. 1 as an example, the transistors included in the upper-half branches 110A and 110B and the lower-half branches 120A and 120B are categorized into 2 transistor groups which are a first transistor group and a second transistor group. Each of the first transistor group and the second transistor group includes two pairs of transistors.

In FIG. 1, each of the transistors categorized into the first transistor group is identified by a dotted line frame. The transistors categorized into the first transistor group include the first P-type transistor MP11, the first P-type transistor MP21, the second N-type transistor MN12 and the second N-type transistor MN22. The first P-type transistor MP11 and the first P-type transistor MP21 are a pair of transistors having symmetrical input/output characteristic since the positions of the first P-type transistor MP11 and the first P-type transistor MP21 in the upper-half branches 110A and 110B correspond to each other. Based on the same rationale, the second N-type transistor MN12 and the second N-type transistor MN22 are another pair of transistors having symmetrical input/output characteristic.

In FIG. 1, each of the transistors categorized into the second transistor group is identified by a dashed line frame. The transistors categorized into the second transistor group include the second P-type transistor MP12, the second P-type transistor MP22, the first N-type transistor MN11 and the first N-type transistor MN21. The second P-type transistor MP12 and the second P-type transistor MP22 are a pair of transistors having symmetrical input/output characteristic. The first N-type transistor MN11 and the first N-type transistor MN21 are another pair of transistors having symmetrical input/output characteristic.

In order to allow the first transistor group and the second transistor group to perform the differential signal receiving process and the reset signal receiving process, the amplifier circuit 100 further includes two groups of input switches SI1 and SI2 and two groups of reset switches SR1 and SR2.

The input switch SI1 corresponds to the first transistor group and is enabled according to an input enabling section of an input control signal CI1 to control the first transistor group to perform the differential signal receiving process to receive differential signal inputs, e.g., the inputs of the first differential input signals VI1+ and VI1−. The input switch SI2 corresponds to the second transistor group and is enabled according to an input enabling section of an input control signal CI2 to control the second transistor group to perform the differential signal receiving process to receive differential signal inputs, e.g., the inputs of the second differential input signal VI2+ and VI2−.

The reset switch SR1 corresponds to the first transistor group and is enabled according to a reset enabling section of a reset control signal CR1 to control the first transistor group to perform the reset signal receiving process to receive reset signal inputs, e.g. the inputs of a first reset signal RS1 and a second reset signal RS2. The reset switch SR2 corresponds to the second transistor group and is enabled according to a reset enabling section of a the reset control signal CR2 to control the second transistor group to perform the reset signal receiving process to receive reset signal inputs, e.g. the inputs of a third reset signal RS3 and a fourth reset signal RS4.

Figure 2:
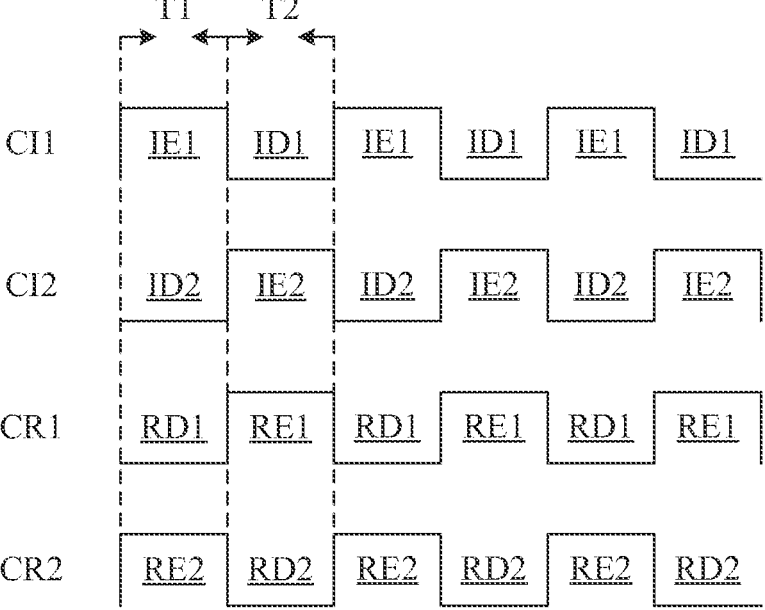
FIG. 2 illustrates a waveform diagram of the input control signals and the reset control signals according to an embodiment of the present invention.

FIG. 2 illustrates a waveform diagram of the input control signals CI1 and CI2 and the reset control signals CR1 and CR2 according to an embodiment of the present invention. In the example of FIG. 2, the enabling state is a high state and corresponds to the enabling section. The disabling state is a low state and corresponds to a disabling section. However, the present invention is not limited thereto.

In a time interval T1 in FIG. 2, the input control signal CI1 corresponds to an input enabling section IE1 to enable the input switch SI1 to control the first transistor group to perform the differential signal receiving process to receive the differential signal inputs. The reset control signal CR1 corresponds to a reset disabling section RD1 to disable the reset switch SR1 to control first transistor group to not perform the reset signal receiving process.

On the other hand, the input control signal CI2 corresponds to an input disabling section ID2 to disable the input switch SI2 to control the second transistor group to not perform the differential signal receiving process. The reset control signal CR2 corresponds to a reset enabling section RE2 to enable the reset switch SR2 to control the second transistor group to perform the reset signal receiving process to receive the reset signal inputs.

Figure 3A:
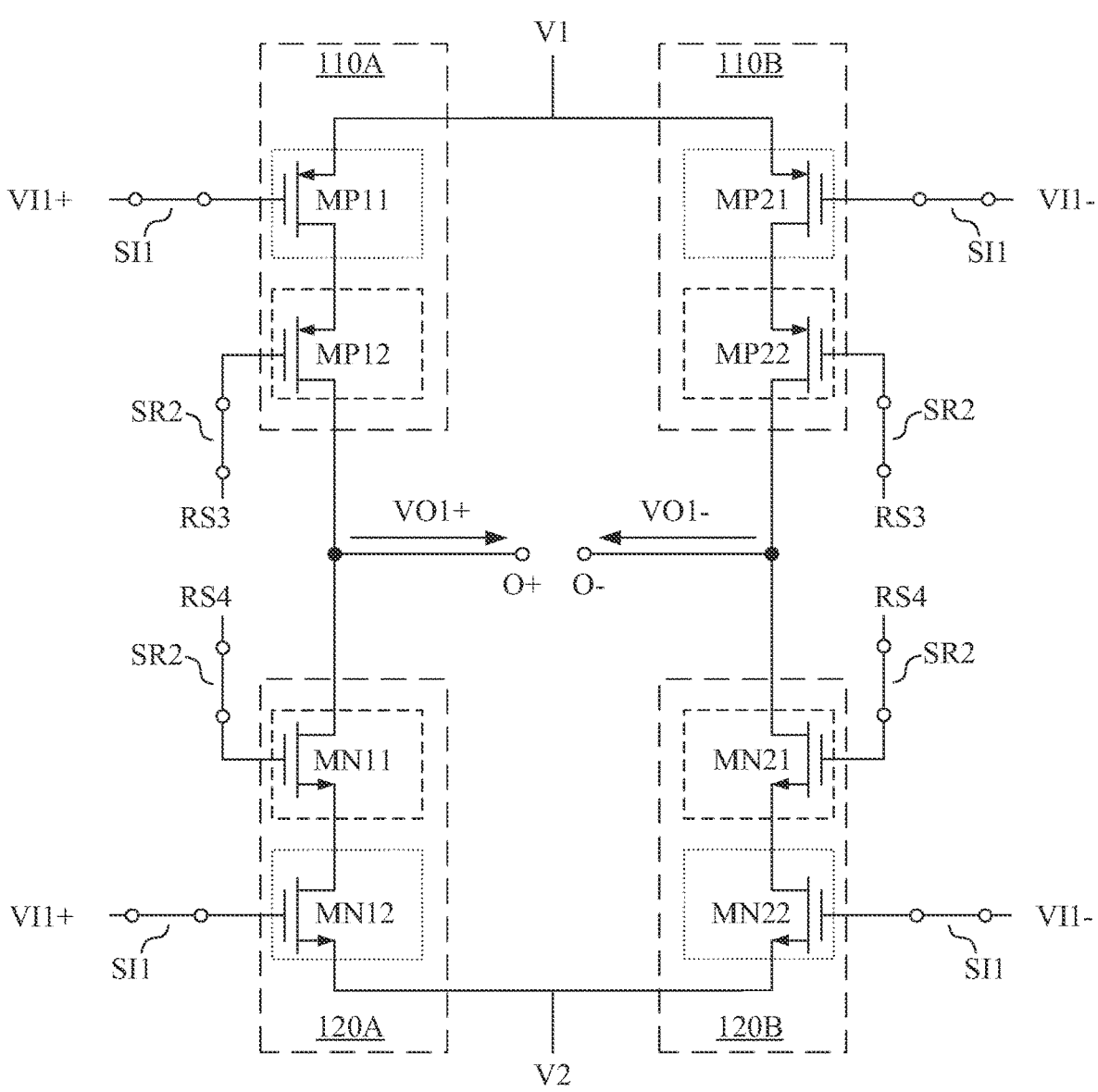
FIG. 3A illustrates an equivalent circuit diagram of the amplifier circuit under the condition that the first transistor group performs the differential signal receiving process and the second transistor group performs the reset signal receiving process according to an embodiment of the present invention.

Reference is now made to FIG. 3A. FIG. 3A illustrates an equivalent circuit diagram of the amplifier circuit 100 under the condition that the first transistor group performs the differential signal receiving process and the second transistor group performs the reset signal receiving process according to an embodiment of the present invention.

As illustrated in FIG. 3A, corresponding to the time interval T1 in FIG. 2, the first P-type transistor MP11, the first P-type transistor MP21, the second N-type transistor MN12 and the second N-type transistor MN22 in the first transistor group receive first differential input signals VI1+ and VI1− through the enabled input switch SI1, so as to generate first differential output signals VO1+ and VO1− at the differential output terminals O+ and O−. The disabled reset switch SR1 is not illustrated in FIG. 3A.

The second P-type transistor MP12 and the second P-type transistor MP22 of the second transistor group receive the third reset signal RS3 through the enabled reset switch SR2, and the first N-type transistor MN11 and the first N-type transistor MN21 of the second transistor group receive the fourth reset signal RS4 through the enabled reset switch SR2. The disabled input switch SI2 is not illustrated in FIG. 3A.

Each of the third reset signal RS3 and the fourth reset signal RS4 actually includes a direct current (DC) component and an alternating current (AC) component.

The direct current component is configured to turn on the second P-type transistor MP12, the second P-type transistor MP22, the first N-type transistor MN11 and the first N-type transistor MN21. The direct current components of the third reset signal RS3 and the fourth reset signal RS4 may have different voltage levels due to different positions in the branches and the transistor characteristics of the transistors corresponding thereto.

For example, under the condition that the first supply voltage V1 is 1 volt, when a cross voltage of each of the first P-type transistor MP11 and the first P-type transistor MP21 being turned on is 0.2 volts and when a threshold voltage of each of the second P-type transistor MP12 and the second P-type transistor MP22 is 0.3 volts, the third reset signal RS3 may include a direct current component of 0.4 volts. Under the condition that the second supply voltage V2 is 0 volt, when a cross voltage of each of the second N-type transistor MN12 and the second N-type transistor MN22 being turned on is 0.2 volts and when a threshold voltage of each of the first N-type transistor MN11 and the first N-type transistor MN21 is 0.2 volts, the fourth reset signal RS4 may include a direct current component of 0.45 volts.

On the other hand, the alternating current component is grounded to clear the electrical charges of the parasitic capacitors related to the performance of the differential signal receiving process of the second P-type transistor MP12, the second P-type transistor MP22, the first N-type transistor MN11 and the first N-type transistor MN21.

Reference is now made to FIG. 2 again. In a time interval T2 in FIG. 2, the input control signal CI1 corresponds to an input disabling section ID1 to disable the input switch SI1 to control the first transistor group to not perform the differential signal receiving process. The reset control signal CR1 corresponds to a reset enabling section RE1 to enable the reset switch SR1 to control the first transistor group to perform the reset signal receiving process to receive the reset signal inputs.

On the other hand, the input control signal CI2 corresponds to the input enabling section IE2 to enable the input switch SI2 to control the second transistor group to perform the differential signal receiving process to receive different signal inputs. The reset control signal CR2 corresponds to a reset disabling section RD2 to disable the reset switch SR2 to control the second transistor group to not perform the reset signal receiving process.

Figure 3B:
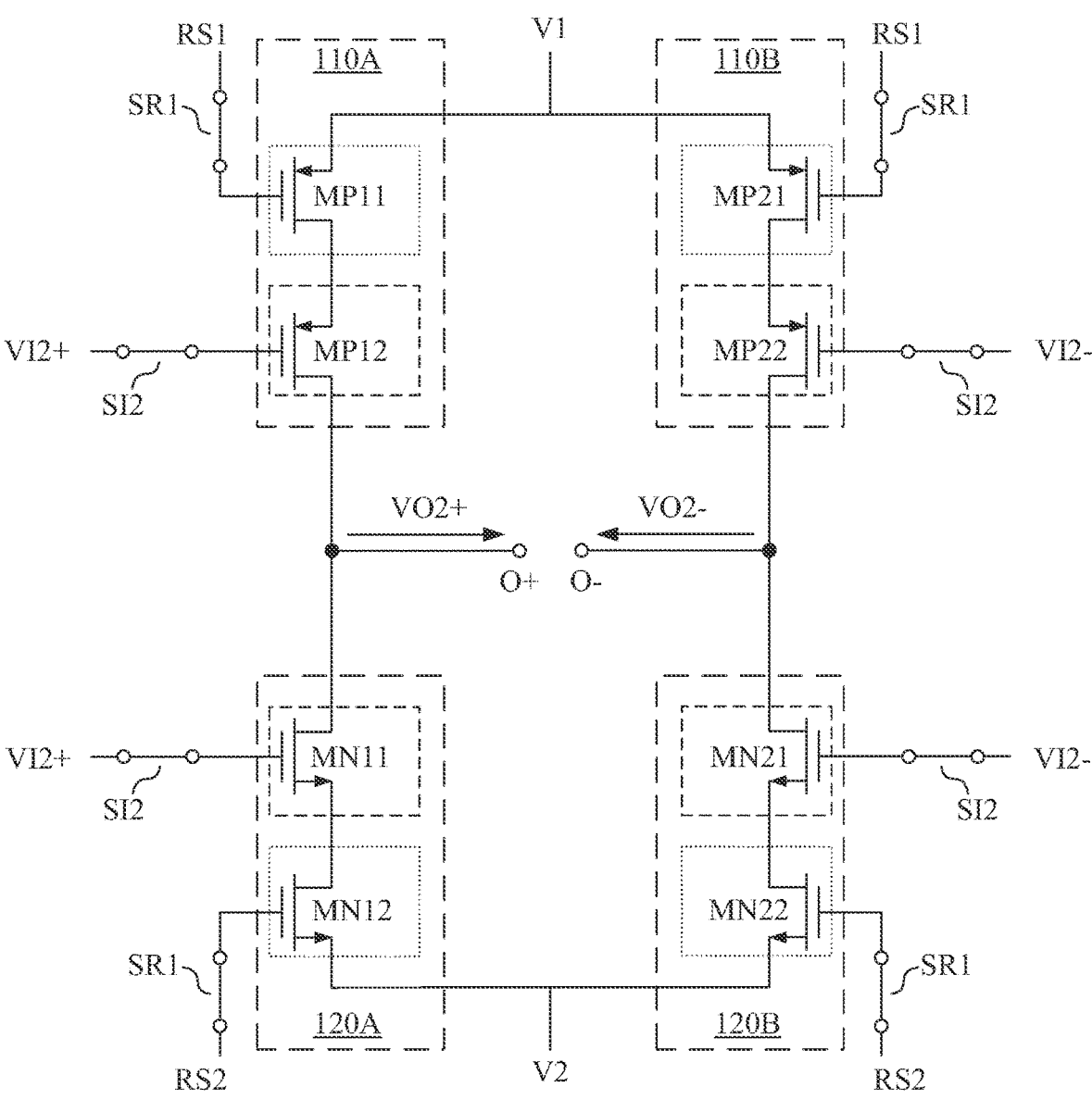
FIG. 3B illustrates an equivalent circuit diagram of the amplifier circuit under the condition that the second transistor group performs the differential signal receiving process and the first transistor group performs the reset signal receiving process according to an embodiment of the present invention.

Reference is now made to FIG. 3B. FIG. 3B illustrates an equivalent circuit diagram of the amplifier circuit 100 under the condition that the second transistor group performs the differential signal receiving process and the first transistor group performs the reset signal receiving process according to an embodiment of the present invention.

As illustrated in FIG. 3B, corresponding to the time interval T2 in FIG. 2, the first P-type transistor MP11 and the first P-type transistor MP21 in the first transistor group receive the first reset signal RS1 through the enabled reset switch SR1. The second N-type transistor MN12 and the second N-type transistor MN22 in the first transistor group receive the second reset signal RS2 through the enabled reset switch SR1. The disabled input switch SI1 is not illustrated in FIG. 3B.

Similarly, each of the first reset signal RS1 and the second reset signal RS2 actually includes a direct current component and an alternating current component.

The direct current component is configured to turn on the first P-type transistor MP11, the first P-type transistor MP21, the second N-type transistor MN12 and the second N-type transistor MN22. The direct current components of the first reset signal RS1 and the second reset signal RS2 may have different voltage levels due to different positions in the branches and the transistor characteristics of the transistors corresponding thereto.

For example, under the condition that the first supply voltage V1 is 1 volt, when a threshold voltage of each of the first P-type transistor MP11 and the first P-type transistor MP21 being turned on is 0.3 volts, the first reset signal RS1 may include a direct current component of 0.6 volts. Under the condition that the second supply voltage V2 is 0 volt, when a threshold voltage of each of the second N-type transistor MN12 and the second N-type transistor MN22 being turned on is 0.2 volts, the second reset signal RS2 may include a direct current component of 0.3 volts.

On the other hand, the alternating current component is grounded to clear the electrical charges of the parasitic capacitors related to the performance of the differential signal receiving process of the first P-type transistor MP11, the first P-type transistor MP21, the second N-type transistor MN12 and the second N-type transistor MN22.

The second P-type transistor MP12, the second P-type transistor MP22, the first N-type transistor MN11, the first N-type transistor MN21 in the second transistor group receive second differential input signals VI2+ and VI2− through the enabled input switch SI2 to generate second differential output signals VO2+ and VO2− at the differential output terminals O+ and O−. The disabled reset switch SR2 is not illustrated in FIG. 3B.

Reference is now made to FIG. 2 again. After the time interval T2, the waveform of each of the signals in the time interval T1 and the time interval T2 is repeated such that the first transistor group and the second transistor group perform operation described above in an interlaced manner in the interlaced input mode. It is appreciated that since the first transistor group and the second transistor group are reset by using the reset signal receiving process when the differential signal receiving process is not performed, no additional time is required to reset these transistors. As a result, a time difference between two neighboring input enabling sections (e.g., the input enabling sections IE1 and IE2) of each of the input control signals CI1 and CI2 can be smaller than a predetermined value, even close to 0.

By using the grouping of the transistor, the second transistor group in the configuration of the amplifier circuit 100 in FIG. 3A forms a cascode structure to increase output impedances of the differential output terminals O+ and O−. The amplifier circuit 100 thus provides a gain applied to the first differential input signals VI1+ and VI1− larger than a gain applied to the second differential input signals VI2+ and VI2−. The first transistor group in the configuration of the amplifier circuit 100 in FIG. 3B forms a current source structure. The amplifier circuit 100 thus provides a power supply rejection ratio (PSRR) applied to the second differential input signals VI2+ and VI2− larger than a power supply rejection ratio applied to the first differential input signals VI1+ and VI1−.

Figure 4:
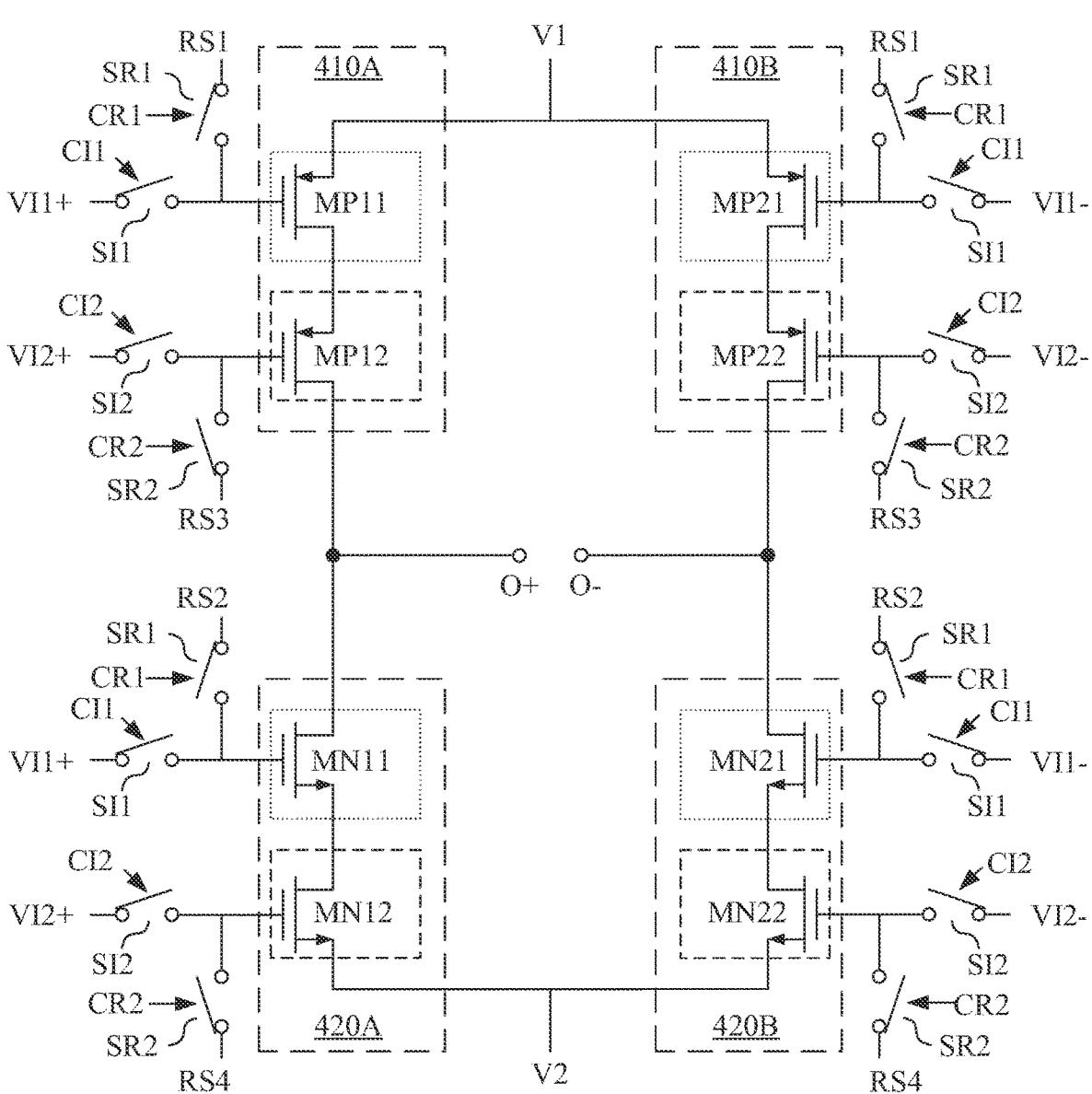
FIG. 4 illustrates a circuit diagram of an amplifier circuit having reset mechanism according to another embodiment of the present invention.

Reference is now made to FIG. 4. FIG. 4 illustrates a circuit diagram of an amplifier circuit 400 having reset mechanism according to another embodiment of the present invention. The amplifier circuit 400 includes a pair of upper-half branches 410A and 410B and a pair of lower-half branches 420A and 420B.

The configuration of the upper-half branches 410A and 410B is identical to the configuration of the upper-half branches 110A and 110B in FIG. 1, in which the upper-half branch 410A includes the first P-type transistor MP11 and the second P-type transistor MP12 and the upper-half branch 410B includes the first P-type transistor MP21 and the second P-type transistor MP22. The configuration of the lower-half branches 420A and 420B is identical to the configuration of the lower-half branches 120A and 120B in FIG. 1, in which the lower-half branch 420A includes the first N-type transistor MN11 and the second N-type transistor MN12 and the lower-half branches 120B includes the first N-type transistor MN21 and the second N-type transistor MN22.

However, in FIG. 4, the first transistor group includes the first P-type transistor MP11, the first P-type transistor MP21, the first N-type transistor MN11 and the first N-type transistor MN21. The second transistor group includes the second P-type transistor MP12, the second P-type transistor MP22, the second N-type transistor MN12 and the second N-type transistor MN22.

As a result, in FIG. 4, the input switch SI1 and the reset switch SR1 correspond to the first transistor group. The input switch S12 and the reset switch SR2 still correspond to the second transistor group. The operation of the input switches SI1 and SI2 and the reset switches SR1 and SR2 is identical to those in the previous embodiment and is not described herein.

Figure 5A:
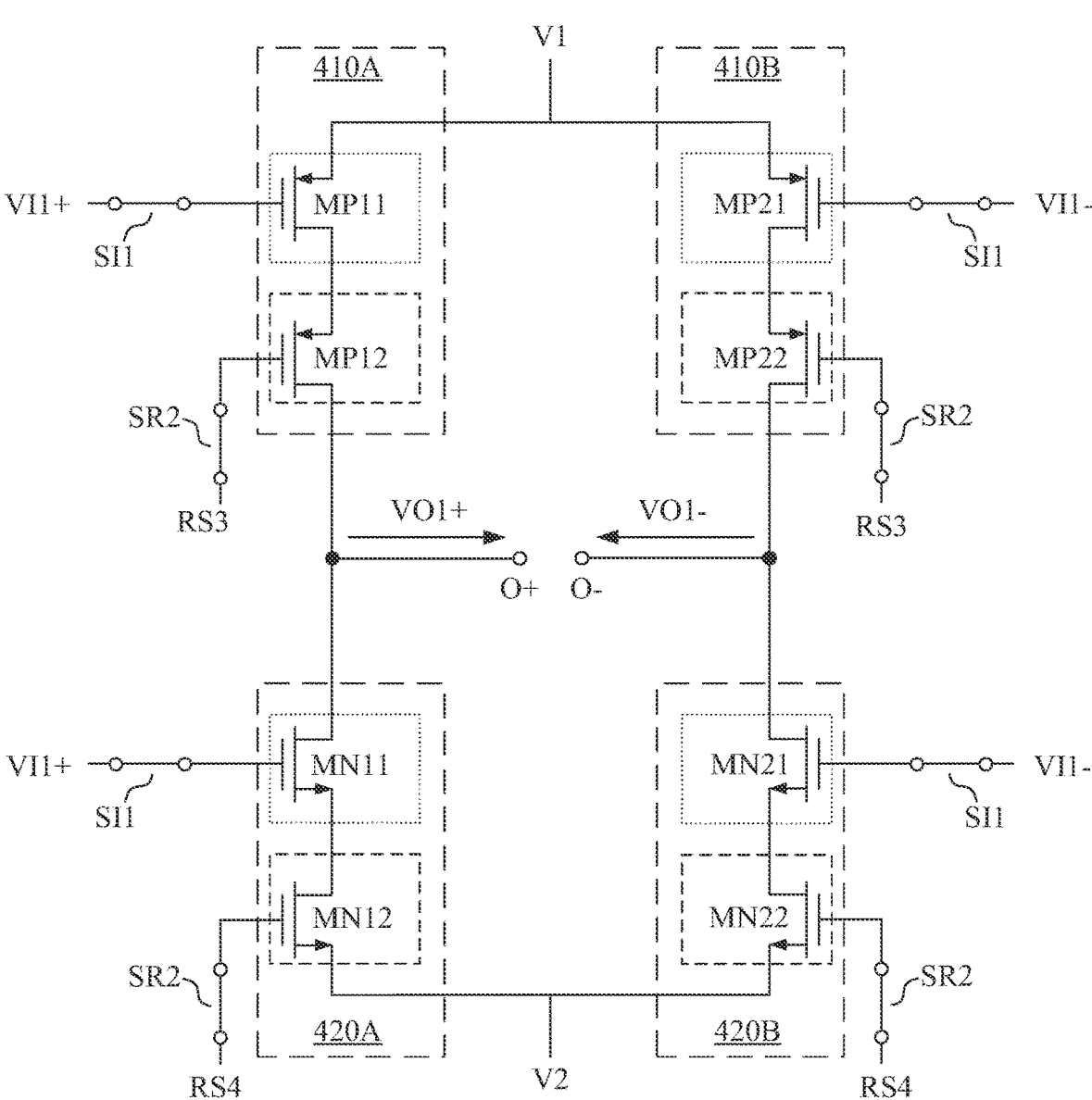
FIG. 5A illustrates an equivalent circuit diagram of the amplifier circuit under the condition that the first transistor group performs the differential signal receiving process and the second transistor group performs the reset signal receiving process according to an embodiment of the present invention.

Reference is now made to FIG. 5A. FIG. 5A illustrates an equivalent circuit diagram of the amplifier circuit 400 under the condition that the first transistor group performs the differential signal receiving process and the second transistor group performs the reset signal receiving process according to an embodiment of the present invention.

The first P-type transistor MP11, the first P-type transistor MP21, the first N-type transistor MN11 and the first N-type transistor MN21 in the first transistor group receive the first differential input signals VI1+ and VI1− through the enabled input switch SI1 and generate the first differential output signals VO1+ and VO1− at the differential output terminals O+ and O−.

The second P-type transistor MP12 and the second P-type transistor MP22 in the second transistor group receive the third reset signal RS3 through the enabled reset switch SR2 and the second N-type transistor MN12 and the second N-type transistor MN22 in the second transistor group receive the fourth reset signal RS4 through the enabled reset switches SR2.

Figure 5B:
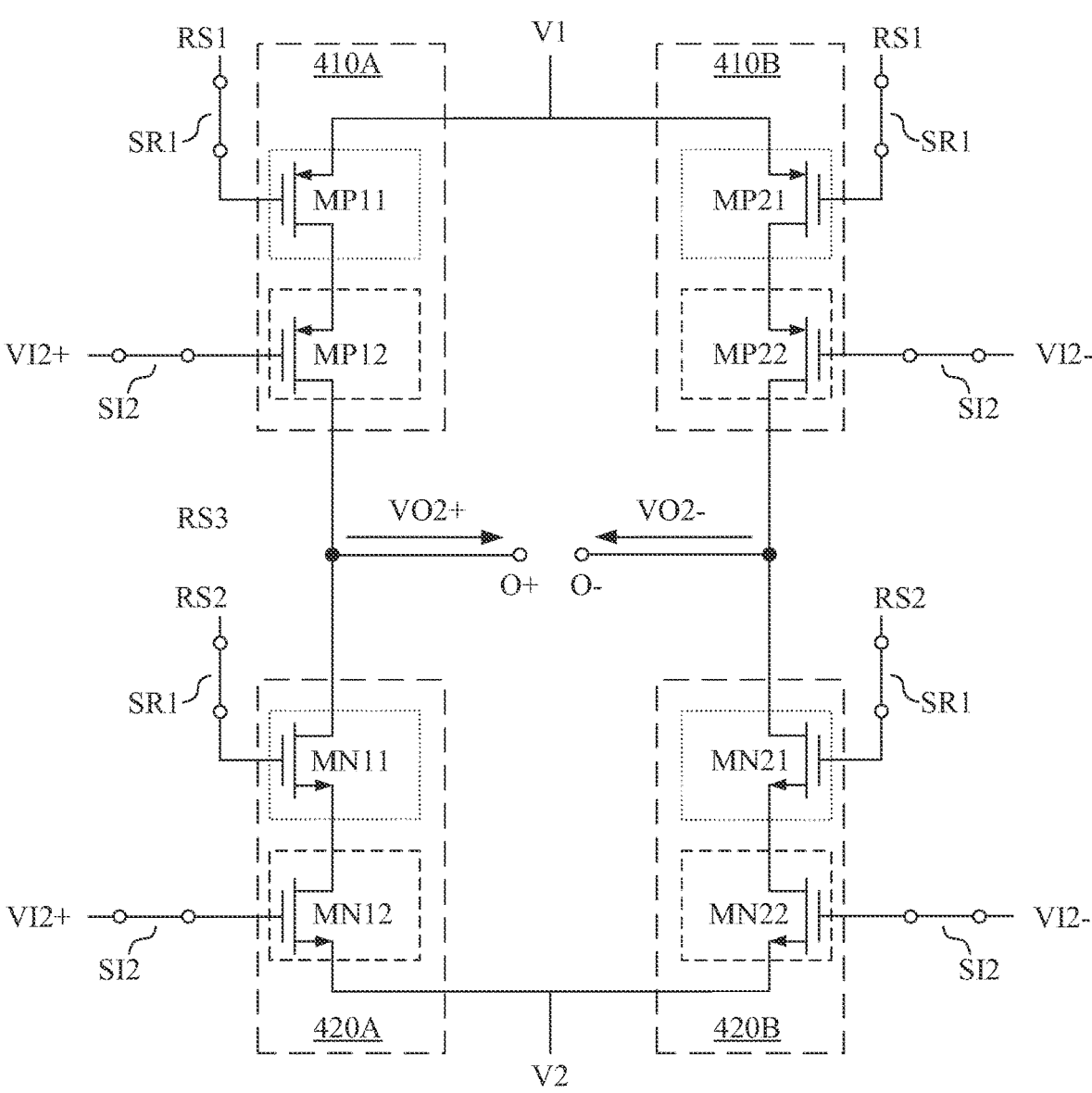
FIG. 5B illustrates an equivalent circuit diagram of the amplifier circuit under the condition that the second transistor group performs the differential signal receiving process and the first transistor group performs the reset signal receiving process according to an embodiment of the present invention.

Reference is now made to FIG. 5B. FIG. 5B illustrates an equivalent circuit diagram of the amplifier circuit 400 under the condition that the second transistor group performs the differential signal receiving process and the first transistor group performs the reset signal receiving process according to an embodiment of the present invention.

The first P-type transistor MP11 and the first P-type transistor MP21 in the first transistor group receive the first reset signal RS1 through the enabled reset switch SR1 and the first N-type transistor MN11 and the first N-type transistor MN21 in the first transistor group receive the second reset signal RS2 through the enabled reset switch SR1.

The second P-type transistor MP12, the second P-type transistor MP22, the second N-type transistor MN12 and the second N-type transistor MN22 in the second transistor group receive the second differential input signals VI2+ and VI2− through the enabled input switch SI2 to generate the second differential output signals VO2+ and VO2− at the differential output terminals O+ and O−.

By using the grouping of the transistor, the configuration of the amplifier circuit 100 in FIG. 5A provides a first gain applied to the first differential input signals VI1+ and VI1− and a second gain applied to the second differential input signals VI2+ and VI2−, in which a difference value between the first gain and the second gain is smaller than a predetermined value. In other words, comparing to the configuration in FIG. 3A and FIG. 3B, the gains applied to the first differential input signals VI1+ and VI1− and the second differential input signals VI2+ and VI2− in FIG. 5A are closer. Further, the configuration of the amplifier circuit 100 in FIG. 5B provides a power supply rejection ratio applied to the second differential input signals VI2+ and VI2− larger than a power supply rejection ratio applied to the first differential input signals VI1+ and VI1−.

Figure 6:
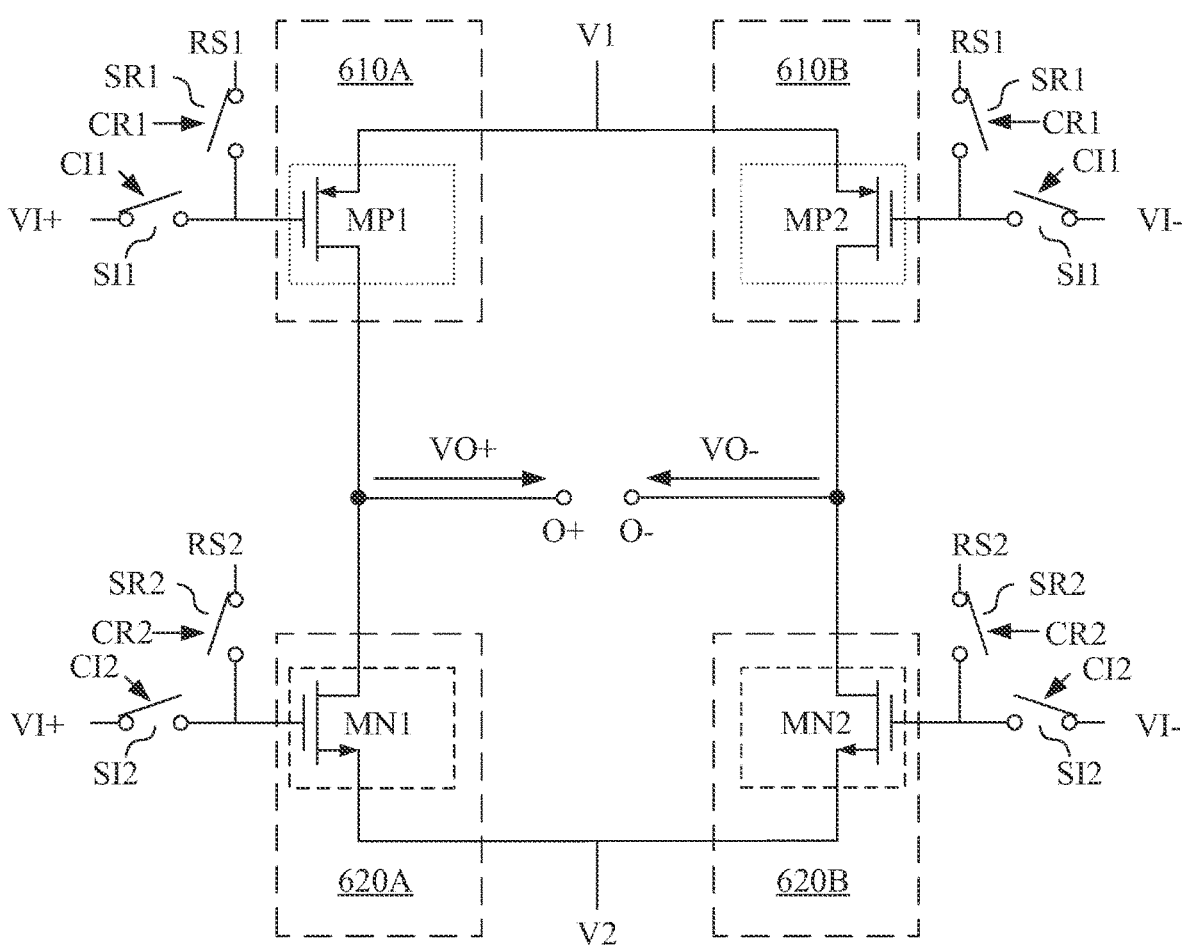
FIG. 6 illustrates a circuit diagram of an amplifier circuit having reset mechanism according to yet another embodiment of the present invention.

Reference is now made to FIG. 6. FIG. 6 illustrates a circuit diagram of an amplifier circuit 600 having reset mechanism according to yet another embodiment of the present invention. The amplifier circuit 600 includes a pair of upper-half branches 610A and 610B and a pair of lower-half branches 620A and 620B.

The upper-half branches 610A and 610B are electrically coupled between the first supply voltage V1 and a pair of the differential output terminals O+ and O−. The upper-half branches 610A and 610B are symmetrical and each includes a P-type transistor. The upper-half branch 610A includes a P-type transistor MP1 and the upper-half branches 610B includes a P-type transistor MP2. The lower-half branches 620A and 620B are electrically coupled between the differential output terminals O+ and O− and the second supply voltage V2. The lower-half branches 620A and 620B are symmetrical and each includes an N-type transistor. The lower-half branch 620A includes an N-type transistor MN1 and the lower-half branch 620B includes an N-type transistor MN2.

The P-type transistor of each of the upper-half branches 610A and 610B and the N-type transistor of each of the lower-half branches 620A and 620B are categorized into a plurality of transistor groups. In the present embodiment, the P-type transistor MP1 and the P-type transistor MP2 are categorized into a first transistor group. The N-type transistor MN1 and the N-type transistor MN2 are categorized into a second transistor group. Each of the first transistor group and the second transistor group includes a pair of transistors.

The amplifier circuit 600 further includes two groups of input switches SI1 and SI2 and two groups of reset switches SR1 and SR2. The input switch SI1 corresponds to the first transistor group and is enabled according to an input enabling section of the input control signal CH to control the first transistor group to perform the differential signal receiving process to receive differential signal inputs, e.g., the input of the differential input signals VI+ and VI−. The input switch SI2 corresponds to the second transistor group and is enabled according to an input enabling section of the input control signal CI2 to control the second transistor group to perform the differential signal receiving process to receive differential signal inputs, e.g., the input of the differential input signal VI+ and VI–.

The reset switch SR1 corresponds to the first transistor group and is enabled according to a reset enabling section of the reset control signal CR1 to control the first transistor group to perform the reset signal receiving process to receive reset signal inputs, e.g., the input of the first reset signal RS1. The reset switch SR2 corresponds to the second transistor group and is enabled according to a reset enabling section of the reset control signal CR2 to control the second transistor group to perform the reset signal receiving process to receive reset signal inputs, e.g., the input of the second reset signal RS2.

Besides the interlaced input mode, the first transistor group and the second transistor group can also operate in a simultaneous input mode. The first transistor group and the second transistor group receive the differential input signals VI+ and VI– in different times in the interlaced input mode to generate the differential output signals VO+ and VO– at the differential output terminals O+ and O–. The first transistor group and the second transistor group receive the differential input signals VI+ and VI– simultaneously in the simultaneous input mode to generate the differential output signals VO+ and VO– at the differential output terminals O+ and O– and simultaneously stop to receive the differential input signals VI+ and VI–.

Figure 7:
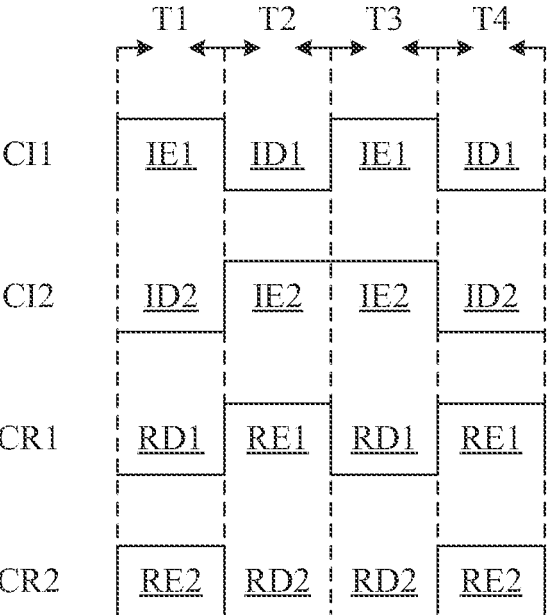
FIG. 7 illustrates a waveform diagram of the input control signals and the reset control signals according to an embodiment of the present invention.

Reference is now made to FIG. 7. FIG. 7 illustrates a waveform diagram of the input control signals CH and CI2 and the reset control signals CR1 and CR2 according to an embodiment of the present invention.

As illustrated in FIG. 7, the time interval T1 and the time interval T2 correspond to the interlaced input mode, in which the input control signals CH and CI2 are operated in the input enabling sections IE1 and IE2 in turn such that the first transistor group receives the differential input signals VI+ and VI– first and the second transistor group receives the differential input signals VI+ and VI– subsequently. Under such a condition, the reset control signals CR2 and CR1 are operated in the reset enabling sections RE2 and RE1 in turn such that the second transistor group is reset first and the first transistor group is reset subsequently.

The time interval T3 and the time interval T4 correspond to the simultaneous input mode, in which the input control signals CI1 and CI2 are simultaneously operated in the input enabling sections IE1 and IE2 first and subsequently operated in the input disabling sections ID1 and ID2 subsequently such that the first transistor group and the second transistor group simultaneously receive the differential input signals VI+ and VI– first and simultaneously stops to receive the differential input signals VI+ and VI– subsequently. Under such a condition, the reset control signals CR1 and CR2 are simultaneously operated in the reset disabling sections RD1 and RD2 first and simultaneously operated in the reset enabling sections RE1 and RE2 subsequently. The first transistor group and the second transistor group are simultaneously not reset first and are simultaneously reset subsequently.

In an embodiment, the amplifier circuit 600 provides a transconductance applied to the differential input signals VI+, VI– in the simultaneous input mode larger than a transconductance applied to the differential input signals VI+, VI– in the interlaced input mode.

It is appreciated that in other embodiments, under the control of the input control signals CI1 and CI2, the second transistor group of the amplifier circuit 600 receives the differential input signals VI+ and VI– first, and the first transistor group of the amplifier circuit 600 receives the differential input signals VI+ and VI– subsequently in the interlaced input mode. Further, the first transistor group and the second transistor group of the amplifier circuit 600 simultaneously stops to receive the differential input signals VI+ and VI– first and simultaneously receive the differential input signals VI+ and VI– in the differential input signals VI+ and VI– subsequently in the simultaneous input mode.

Similar to the previous embodiment, a time difference between two neighboring input enabling sections of each of the input control signals CH and CI2 can be smaller than a predetermined value. The detail is not described herein.

It is appreciated that the embodiments described above are merely an example. In other embodiments, it is appreciated that many modifications and changes may be made by those of ordinary skill in the art without departing, from the spirit of the invention. For example, the number of the transistors included in each of the upper-half branches and the lower-half branches of the amplifier circuit can be any number that is larger than two. The transistors can be categorized into more than two transistor groups to perform the differential signal receiving process in an interlaced manner such that the transistor groups that do not perform differential signal receiving process are AC grounded so as to be reset.

In summary, the amplifier circuit having reset mechanism of the present invention performs alternating current reset on the transistor group when the transistor group does not perform the differential signal receiving process, to reduce the effect of the remained electrical charges from the parasitic capacitors on the differential output signal generated by the transistor groups operated in an interlaced input mode.

The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. An amplifier circuit having reset mechanism, comprising:

a pair of upper-half branches electrically coupled between a first supply voltage and a pair of differential output terminals, wherein the pair of upper-half branches are symmetrical and each includes at least one P-type transistor, wherein the pair of upper-half branches are symmetrical and each comprises at least one P-type transistor; and a pair of lower-half branches electrically coupled between the pair of differential output terminals and a second supply voltage, wherein the lower-half branches are symmetrical and each comprises at least one N-type transistor;

wherein the P-type transistors comprised by the upper-half branches and the N-type transistors comprised by the lower-half branches are categorized into a plurality of transistor groups such that the transistor groups in turn perform a differential signal receiving process in an interlaced manner under an interlaced input mode, and the transistor groups perform a reset signal receiving process when the differential signal receiving process is not performed to be turned on and be AC grounded such that the differential output terminals generate differential outputs;

wherein each of the transistor groups includes M pairs of transistors each having a symmetrical input/output characteristic relative to the differential output terminals, M being a positive integer larger than or equal to 1.

2. The amplifier circuit of claim 1, wherein each of the upper-half branches comprises a first P-type transistor and a second P-type transistor in turn electrically coupled between the first supply voltage and the pair of differential output terminals;

wherein the first P-type transistor, the second P-type transistor, the first N-type transistor and the second N-type transistor are categorized into a first transistor group and a second transistor group.

3. The amplifier circuit of claim 2, wherein the first P-type transistor comprised by each of the upper-half branches and the second N-type transistor comprised by each of the lower-half branches are categorized into the first transistor group, and the second P-type transistor comprised by each of the upper-half branches and the first N-type transistor comprised by the lower-half branches are categorized into the second transistor group;

the first transistor group, when the differential signal receiving process is performed, is configured to receive a first differential input signal by the first P-type transistor of each of the upper-half branches and the second N-type transistor of each of the lower-half branches to generate a first differential output signal at the differential output terminals;

the first transistor group, when the reset signal receiving process is performed, is configured to receive a first reset signal by the first P-type transistor of each of the upper-half branches and receive a second reset signal by the second N-type transistor of each of the lower-half branches;

the second transistor group, when the differential signal receiving process is performed, is configured to receive a second differential input signal by the second P-type transistor of each of the upper-half branches and the first N-type transistor of each of the lower-half branches to generate a second differential output signal at the differential output terminals;

the second transistor group, when the reset signal receiving process is performed, is configured to receive a third reset signal by the second P-type transistor of each of the upper-half branches and receive a fourth reset signal by the first N-type transistor of the lower-half branches.

4. The amplifier circuit of claim 3, wherein the amplifier circuit provides a gain applied to the first differential input signal larger than a gain applied to the second differential input signal, and provides a power supply rejection ratio (PSRR) applied to the second differential input signal larger than a power supply rejection ratio applied to the first differential input signal.

5. The amplifier circuit of claim 2, wherein the first P-type transistor comprised by each of the upper-half branches and the first N-type transistor comprised by each of the lower-half branches are categorized into the first transistor group, and the second P-type transistor comprised by each of the upper-half branches and the second N-type transistor comprised by each of the lower-half branches are categorized into the second transistor group;

the first transistor group, when the differential signal receiving process is performed, is configured to receive a first differential input signal by the first P-type transistor of each of the upper-half branches and the first N-type transistor of each of the lower-half branches to generate a first differential output signal at the differential output terminals;

the first transistor group, when the reset signal receiving process is performed, is configured to receive a first reset signal by the first P-type transistor of each of the upper-half branches and receive a second reset signal by the first N-type transistor of each of the lower-half branches;

the second transistor group, when the differential signal receiving process is performed, is configured to receive a second differential input signal by the second P-type transistor of each of the upper-half branches and the second N-type transistor of each of the lower-half branches to generate a second differential output signal at the differential output terminals;

the second transistor group, when the reset signal receiving process is performed, is configured to receive a third reset signal by the second P-type transistor of each of the upper-half branches and receive a fourth reset signal by the second N-type transistor of the lower-half branches.

6. The amplifier circuit of claim 5, wherein the amplifier circuit provides a first gain applied to the first differential input signal and a second gain applied to the second differential input signal, in which a difference value between the first gain and the second gain is smaller than a predetermined value, and the amplifier circuit provides a power supply rejection ratio applied to the second differential input signal larger than a power supply rejection ratio applied to the first differential input signal.

7. The amplifier circuit of claim 2, further comprising:

two groups of input switches configured to be enabled according to an input enabling section of each of two input control signals to respectively control the first transistor group and the second transistor group to perform the differential signal receiving process to receive differential signal inputs; and two groups of reset switches configured to be enabled according to a reset enabling section of each of two reset control signals to respectively control the first transistor group and the second transistor group to perform the reset signal receiving process to receive reset signal inputs;

wherein a time difference between two neighboring input enabling sections of each of the two input control signals is smaller than a predetermined value.

8. The amplifier circuit of claim 1, wherein each of the upper-half branches comprises a P-type transistor and each of the lower-half branches comprises an N-type transistor;

the P-type transistor of each of the upper-half branches is categorized into a first transistor group and the N-type transistor of each of the lower-half branches is categorized into a second transistor group;

the first transistor group and the second transistor group are configured to operate in the interlaced input mode and a simultaneous input mode, so as to receive a differential input signal in different times in the interlaced input mode to generate a differential output signal at the differential output terminals, and receive the differential input signal simultaneously in the simultaneous input mode to generate the differential output signal at the differential output terminals and simultaneously stop to receive the differential input signal.

9. The amplifier circuit of claim 8, further comprising:

two groups of input switches configured to be enabled according to an input enabling section of each of two input control signals to respectively control the first transistor group and the second transistor group to perform the differential signal receiving process to receive differential signal inputs; and two groups of reset switches configured to be enabled according to a reset enabling section of each of two reset control signals to respectively control the first transistor group and the second transistor group to perform the reset signal receiving process to receive reset signal inputs;

wherein a time difference between two neighboring input enabling sections of each of the two input control signals is smaller than a predetermined value.

10. The amplifier circuit of claim 8, wherein in the interlaced input mode, either the first transistor group receives the differential input signal first and the second transistor group receives the differential input signal subsequently, or the second transistor group receives the differential input signal first and the first transistor group receives the differential input signal subsequently;

in the simultaneous input mode, either the first transistor group and the second transistor group receives the differential input signal simultaneously and subsequently stops to receive the differential input signal simultaneously, or the first transistor group and the second transistor group stops to receive the differential input signal simultaneously and subsequently receives the differential input signal simultaneously.

11. The amplifier circuit of claim 8, wherein the amplifier circuit provides a transconductance applied to the differential input signal in the simultaneous input mode larger than a transconductance applied to the differential input signal in the interlaced input mode.

* * * * *